United States Patent [19]

George et al.

[11] Patent Number: 5,736,060

[45] Date of Patent: Apr. 7, 1998

[54] READ SENSITIVITY MR HEAD USING PERMANENT MAGNET LONGITUDINAL STABILIZATION

[75] Inventors: Peter Kurt George, Bloomington, Minn.; Garrett Aquila Garrettson, Los Altos, Calif.

[73] Assignee: Seagate Technology, Inc., Scotts Valley, Calif.

[21] Appl. No.: 863,606

[22] Filed: May 27, 1997

Related U.S. Application Data

[63] Continuation of Ser. No. 468,779, Jun. 6, 1995, abandoned, which is a continuation of Ser. No. 420,450, Apr. 10, 1995, which is a continuation of Ser. No. 936,185, Aug. 25, 1992, abandoned.

[51] Int. Cl.$^6$ ............................ G01R 33/02; G11C 19/08
[52] U.S. Cl. ...................... 216/22; 29/603.13; 324/252; 338/32 R; 360/113
[58] Field of Search .................... 360/113; 324/252; 338/32 R; 29/603.13, 603.14, 603.15; 216/22

[56] References Cited

U.S. PATENT DOCUMENTS

| | | | |
|---|---|---|---|
| 3,987,485 | 10/1976 | Sugaya et al. | 360/63 |
| 4,052,748 | 10/1977 | Kuijk | 360/113 |
| 4,802,043 | 1/1989 | Smith | 360/113 |
| 4,843,505 | 6/1989 | Mowry | 360/113 |
| 4,956,736 | 9/1990 | Smith | 360/113 |
| 4,967,298 | 10/1990 | Mowry | 360/113 |
| 4,967,598 | 11/1990 | Wakatsuki et al. | 73/517 |
| 4,987,508 | 1/1991 | Smith | 360/113 |
| 5,018,037 | 5/1991 | Krounbi et al. | 360/113 |
| 5,079,035 | 1/1992 | Krounbi et al. | 427/130 |
| 5,206,590 | 4/1993 | Dieny et al. | 324/252 |
| 5,285,339 | 2/1994 | Chen et al. | 360/113 |
| 5,287,238 | 2/1994 | Baumgart et al. | 360/113 |
| 5,309,304 | 5/1994 | Naberhuis et al. | 360/113 |

FOREIGN PATENT DOCUMENTS

| | | |
|---|---|---|
| 0 326 749 A3 | 8/1989 | European Pat. Off. . |
| 62-137-713 | 6/1987 | Japan ................ G11B 5/39 |
| 64-1112 | 1/1989 | Japan . |

OTHER PUBLICATIONS

Patent Abstracts of Japan, vol. 013, No. 162 (P–859), 19 Apr. 1989 & JP–A–64 001112 (Hitachi Ltd) 5 Jan. 1989.

Patent Abstracts of Japan, vol. 002 No. 013 (E–008), 28 Jan. 1978 & JP–A–52 130614 (NEC Corp) 2 Nov. 1977.

Patent Abstracts of Japan, vol. 006 No. 034 (P–104), 2 Mar. 1982 & JP–A–56 153523 (Hitachi Ltd.) 27 Nov. 1981.

Patent Abstracts of Japan, vol. 008 No. 036 (E–227), 16 Feb. 1984 & JP–A–58 192391 (Hitachi Seisakusho KK) 9 Nov. 1983.

Patent Abstracts of Japan, vol. 7 No. 202 (P–221), 7 Sep. 1983 & JP–A–58 1000216 (Hitachi Seisakusho KK) 14 Jun. 1983.

*Primary Examiner*—Thorl Chea
*Attorney, Agent, or Firm*—Kinney & Lange, P.A.

[57] ABSTRACT

A method of making an MR sensor having a nearly symmetric read sensitivity across the sensor by using permanent magnet boundary control. The sensor's MR element is patterned to eliminate portions of the MR element between the electrical contacts which contribute to undesired read sensitivity. The MR element is maintained in a single domain state using abutting permanent magnets electrically isolated from the MR element.

21 Claims, 10 Drawing Sheets

READ SENSITIVITY MR HEAD USING PERMANENT MAGNET LONGITUDINAL STABILIZATION

This is a continuation of application Ser. No. 08/468,779, filed Jun 6, 1995, now abandoned, which in turn is a continuation of application Ser. No. 08/420,450, filed Apr. 10, 1995, now abandoned, which in turn is a continuation of application Ser. No. 07/936,185, filed Aug. 25, 1992, now abandoned.

BACKGROUND OF THE INVENTION

1. Field of the Invention

The invention relates to magnetic recording disk drives and more particularly to magnetoresistive heads therefor.

2. Brief Description of the Prior Art

Figures 1, 2:
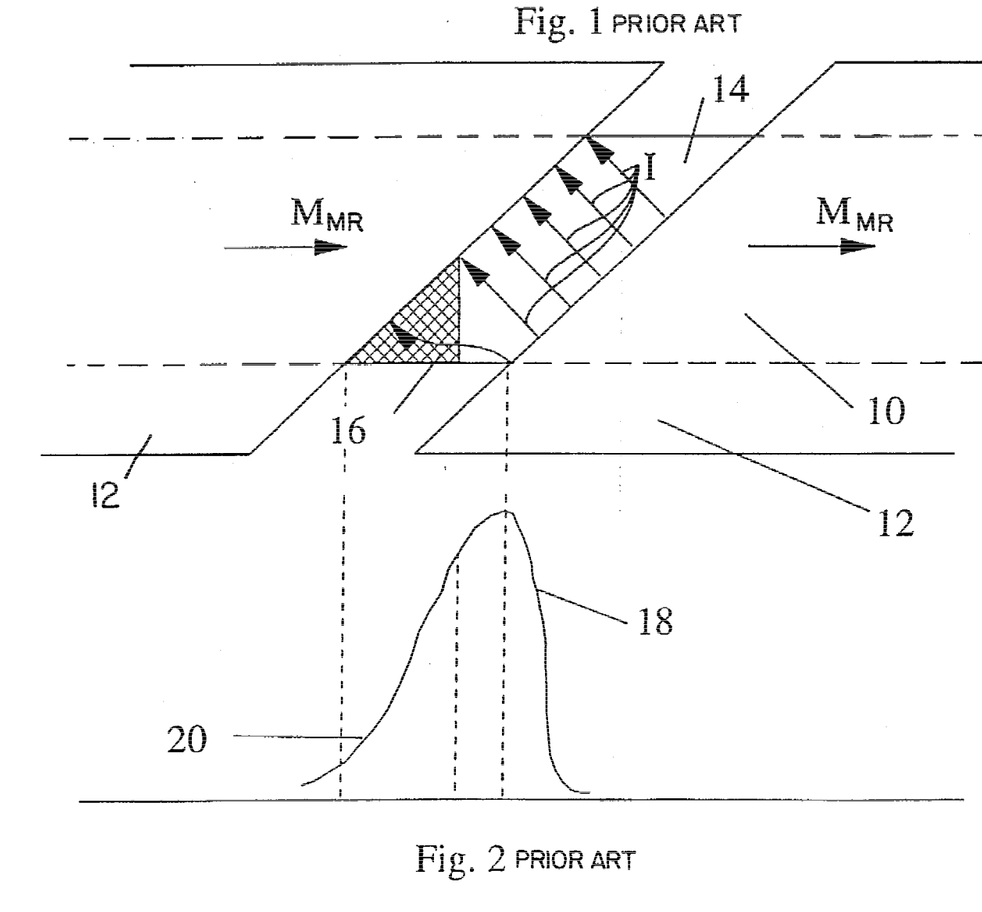
FIG. 1 is a plan view diagram of the essential layers of a conventional, canted-current MR sensor.
FIG. 2 shows the read sensitivity function for the sensor of FIG. 1.

Magnetoresistive (MR) heads of the canted-current type derived from a head type known as a barber pole MR head, exhibit a skewed read sensitivity function primarily due to tile variation in distance of the contact edges from the input surface (the sensor's output is proportional to this distance), particularly the sharp corners between the contacts and the MR element. The problem is illustrated in FIG. 1, where the MR element 10 extends left to right in the figure and the contacts 12 am canted across the sensor at approximately 45 degrees, creating a sense region where current I primarily flows (perpendicular to the contact edges) across the sense region at approximately 45 degrees relative to the MR element's magnetization vector $M_{MR}$. However, in the cross-hatched triangular region 16, current flows at a shallower angle more parallel with the MR element's magnetization vector than it is in the center of the sense region. Because of magnetization rotation and the presence of sense current in this region, detection is still possible. As a result, the read sensitivity extends farther to the left than to the right thus producing a skewed read sensitivity function.

The read sensitivity function we discuss herein is the sensitivity of the sensor vs. location across the sensor for a microtrack of recorded information less than one micrometer in width. The read sensitivity function for the MR sensor illustrated in FIG. 1 is shown in FIG. 2 as line 18. Due to the of the current vector I and the MR element's magnetization vector $M_{MR}$ in the cross-hatched region 16, the read sensitivity function 18 is asymmetric and exhibits a substantially large tail 20 extending to the left in the figure.

There are two problems when using such an asymmetric MR sensor in a application such as a magnetic disk drive in which the MR sensor may be required to read both data and servo information from very narrow tracks on a magnetic disk surface. The first problem is noise and cross-talk because of the excessively long tail on the read sensitivity function. The second is the use of the sensor to read analog servo data. Due to the asymmetrical nature of the read sensitivity function, the response to servo data from left and right are not equivalent - thus requiring special compensation to make this application practical.

One proposed solution to this problem is to deactivate the undesired region 16 by poisoning the MR element (Permalloy) by diffusion or ion implantation. Applicant's solution is to substitute for the MR element (Permalloy) in the undesired region another material where the change in resistivity vs. magnetization is essentially zero.

SUMMARY OF THE INVENTION

The invention comprises patterning the MR element so as to substantially eliminate the undesired "read sensitivity" region such as illustrated in FIG. 1, and then stabilizing the patterned element using a hard or permanent magnetic layer at the certain zones of the MR element's boundary so as to eliminate the internal demagnetizing fields at these boundaries which cause the element to fracture into multiple domains, which, in turn, causes Barkhausen noise when the element is used as a magnetic field sensor. The total magnetic flux of the permanent magnet layer at a boundary (essentially proportional to the magnetization times the layer's thickness) is held approximately the same as the total magnetic flux of the region of the MR element that was eliminated as above described. This prevents the permanent magnet layer from inducing an undesired longitudinal bias field in the sense region of the IVIR element. Such longitudinal bias fields act to reduce the element's sensitivity to input transverse magnet fields.

When the magnetization of the respective sectors have the same direction at the boundary, this is accomplished by holding the magnetization times thickness of the permanent magnet layer to a value which is approximately the same as the magnetization time thickness of the MR element. When the magnetization vectors differ in direction, the pole densities established by the moment discontinuities must be matched.

It is an alternative object of the invention to use the permanent magnetic field induced by the permanent magnetic elements at the boundaries of the patterned MR element to maintain the at-rest magnetization vector of the MR element at an appropriate bias angle so that the current contacts for the sense current can be aligned relatively perpendicular to the air bearing surface of a magnetic head. This reduces lapping tolerance problems with respect to relative alignment of read and write structures.

It is a further object of the invention to provide a lip type flux guide into the active region of the MR sensor as a part of the overall MR element. The lip preferably is stabilized at its boundaries by permanent magnetic layers.

It is a further object to pattern the permanent magnet layer's magnetization vector and the sensors electrical contacts so the lip's at rest magnetization vector is substantially parallel to the current vector. The lip then provides substantially no component of the sensor output, but rather acts as a flux guide for the active area.

It is a further object of the invention to provide boundary control stabilization of the MR element using abutting permanent magnetic layers with low electrical conductivity.

It is a further object of the invention to provide boundary control stabilization of an MR element using abutting permanent magnet layers without electrical continuity to the MR element.

BRIEF DESCRIPTION OF THE DRAWINGS

FIG. 6b is a cross section along 6b–6b' of FIG. 6a.

DETAILED DESCRIPTION OF THE PREFERRED EMBODIMENTS

Figure 3:
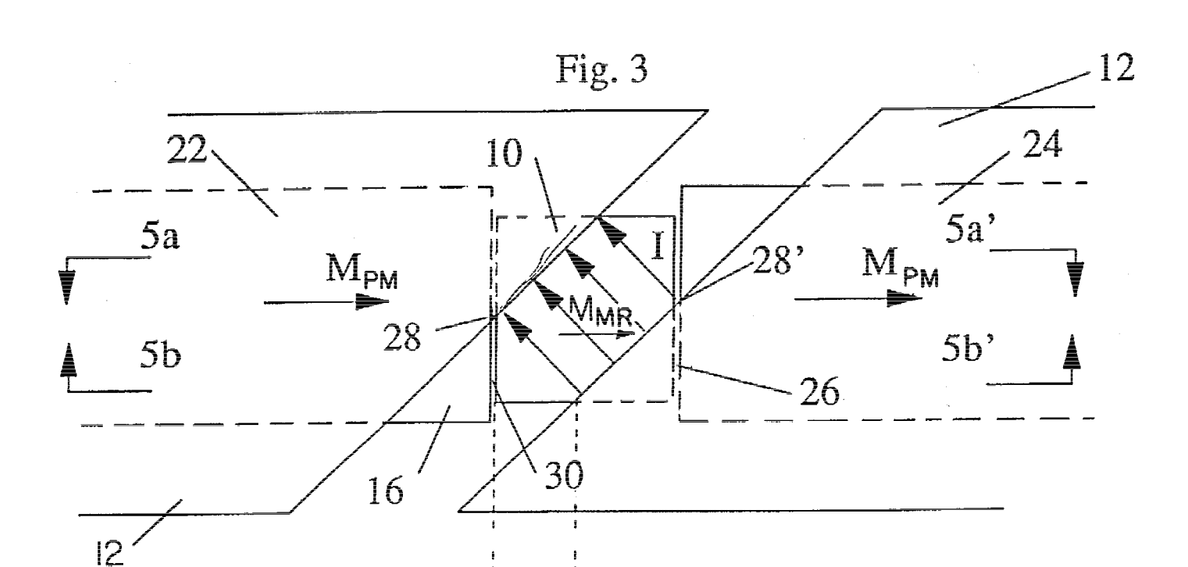
FIG. 3 is a diagram of a Magnetoresistive sensor according to a preferred embodiment of the present invention.

FIG. 3 is a diagram of a preferred embodiment of the present invention. The figure shows a canted-current configured magnetoresistive sensor in which the current contacts 12 are substantially canted across the MR element while the magnetization vector $M_{MR}$ of the element is aligned along the width of the sensor. In the figure, the MR element is defined as a substantially square element 10, centered between the gap in current contacts 12. The ends of the MR element are stabilized by permanent magnetic layers 22 and 24, with each permanent magnet layer having a magnetization vector $M_{PM}$. The permanent magnetic layers 22 and 24 abut the ends of the square MR element (MRE), but are separated therefrom by gaps 26. The sense current contacts 12 overlay these layers and have edges which cross the MRE at approximately 45° to $M_{MR}$, with the distance between the contacts chosen such that the points 28 and 28' where the respective contacts 12 cross the gaps 26 lie close to the horizontal center of the MR element. Arrows 11a and 11b define the location of the air bearing surface after lapping.

In this configuration, the sense current i flows between the contacts 12 substantially only in a central region defined between these two intersections, 28 and 28', and does not flow through the undesired region 16 due to gaps 26. The elongated tail in the read sensitivity function on the left is therefore eliminated.

Figure 4:
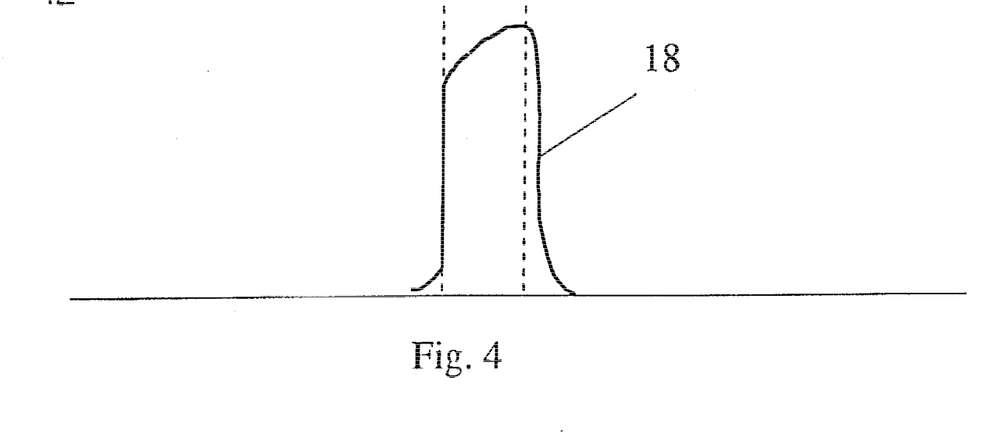
FIG. 4 shows the read sensitivity function of the sensor of FIG. 3.
Figure 5A:
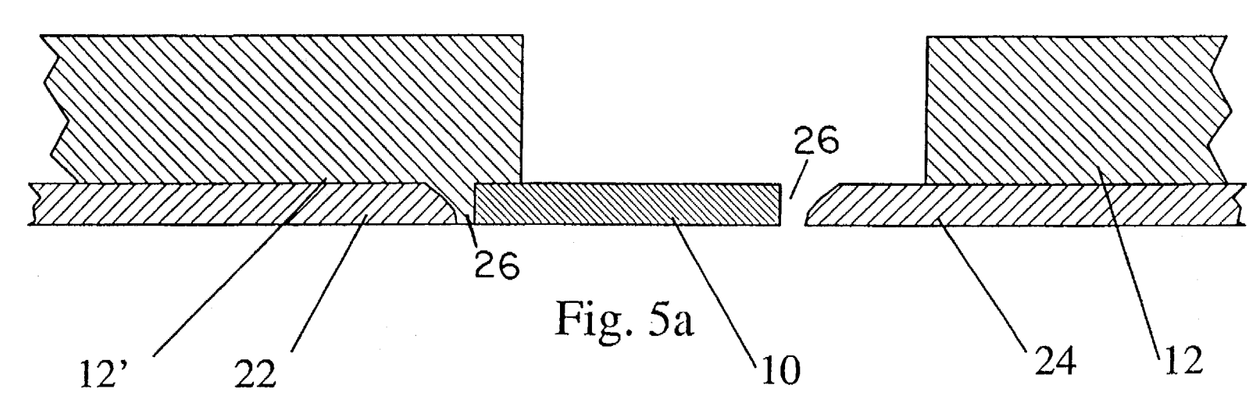
FIG. 5a & 5b are cross sections along 5a–5a' and 5b–5b' of FIG. 3.
Figure 5B:
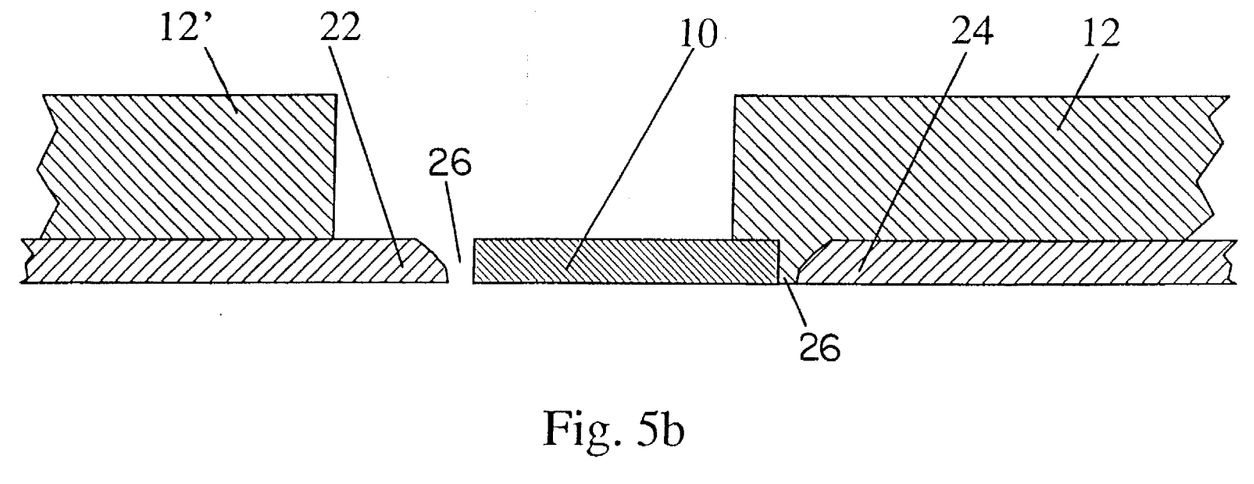

Because the effective sense current is confined as above described, the read sensitivity function is substantially symmetrical and "squared up" as illustrated in FIG. 4. The output from region 16 is eliminated, cutting off the troublesome tail 20 in FIG. 2. Turning to FIGS. 5a and 5b, which are partial cross-sections along 5a–5a' and 5b–5b' in FIG. 3, the permanent magnetic layers 22 and 24 are shown in combination with Magnetoresistive layer 10 and metallic current contacts 12. Due to the requirement to control the magnetic boundary conditions between the permanent layers 22 and 24 in the magnetoresistive layer 10, which will be discussed subsequently, the magnetoresistive layer 10 will typically be substantially the same thickness as the permanent magnetic layers 22 and 24. Conventionally, the Magnetoresistive layer will be on the order of 300 angstroms thick. As illustrated in the figure, the preferred permanent magnetic layers 22 and 24 will also be on the order of 300 angstroms thick. As is well known in the art, the metallic current contacts 12 can be made substantially thicker than either the permanent magnetic or Magnetoresistive layers. In the figure, the contacts 12 are preferably on the order of 1000 angstroms thick.

While the preferred embodiment has a gap between permanent magnet and magnetoresistive layer, this is not necessary if the permanent magnet layer's resistivity is chosen such that it is much higher than that of the MR layer. With such a configuration, the sensor may be formed using methods such as disclosed in U.S. Pat. No. 5,079,035, which is hereby incorporated by reference as if fully set forth herein. See also U.S. Pat. No. 5,018,037. A preferred method for forming a gap between the ends of the layers will be discussed in relation to FIGS. 7a–d.

In the preferred embodiment, the magnetoresistive element is preferably composed of the alloy $Ni_{82}Fe_{18}$ (Permalloy). The permanent magnetic layers are preferably one of the following (or similar) alloys: $CO_{78}Pt_{22}$; $CO_{78}Cr_8 Pt_{14}$; or $CO_{80}Sm_{20}$. The contacts layers are preferably composed of a trilayer of Mo-Au-Mo, but many other conducting metals may be used.

A single-domain MR element having edges at which magnetization $M_{MR}$ is directed other than parallel to the edge will exhibit a net external magnetic field at the edges which may cause the element to become unstable. These edge regions can then "fracture" into multiple domains with the net internal field of one domain canceling the net internal field of adjacent domains.

In order to maintain such an element in a single domain state, various techniques may be employed, one of which is to apply an external magnetic field in order to keep magnetic dipoles of the crystalline alloy aligned in the preferred direction. This has been know in the past as "longitudinal biasing." See e.g., U.S. Pat. No. 4,967,298 for a discussion of the single domain problem and its previously known solutions.

In the past, the exact amount of external magnetic field necessary to keep an MR element in a single domain state has not been fully explored. See for example the discussion in the aforementioned '037 patent at column 2, ll. 3–4.

We believe that the proper amount of permanent magnetic layer is that sufficient to produce the same magnetic flux as that of the saturated MR element layer at the boundary of the MR element. Exceeding this amount of flux-although it also serves to keep the MR element in a single domain state will act to decrease the sensitivity of the MR element to (transverse) input flux.

Because the length of contact (into the figure) between the layers at their abutting end regions are equal, the flux matching requirement can be expressed as $$M_{PM} * t_{PM} = M_{MR} * t_{MR}$$

where $M_{PM}$ and $M_{MR}$ are the respective at-rest magnetizations of the permanent magnet layer and the MR layer, and $t_{PM}$ and $t_{MR}$ are the respective thickness of the permanent magnet layer and the MR layer. Because the magnetization of typical permanent magnetic materials to be used in the present application are approximately equal to that of the MR materials, the permanent magnetic layer will be approximately as thick as the MR layer. For Permalloy which typically has a square loop, $M_{MR}$ is close to the saturation value $M_s$.

With the permanent magnetic layer thickness thus chosen, not only are demagnetizing fields in the MR element layer controlled, but there is little or no "excess" longitudinal magnetic field in the central active region of the MR element which would interfere with sensor performance.

Returning to FIG. 3 for a moment, it was above noted that in some configurations, current could flow in the undesired region 16. This current will not affect the read sensitivity function because the material located in the undesired region does not exhibit a magnetoresistive response. However, any current flowing in this area detracts from the current that could flow in the sense region and is therefore undesirable from the efficiency standpoint.

Figure 6A:
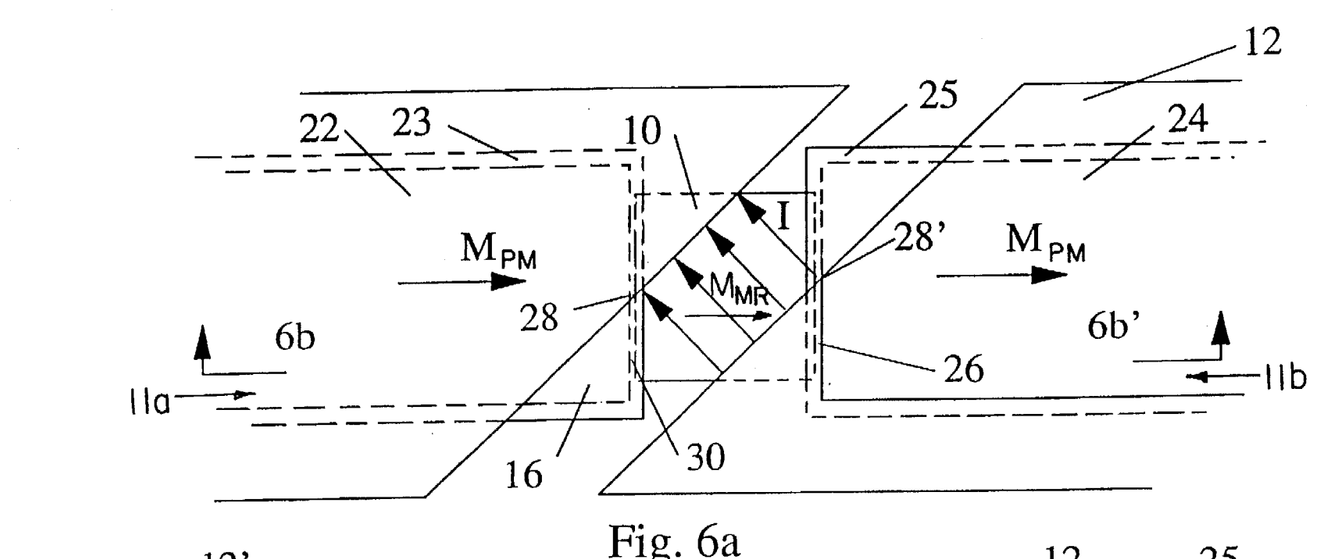
FIG. 6a is a diagram of an alternative magnetoresistive sensor having an optional insulator layer.
Figure 6B:
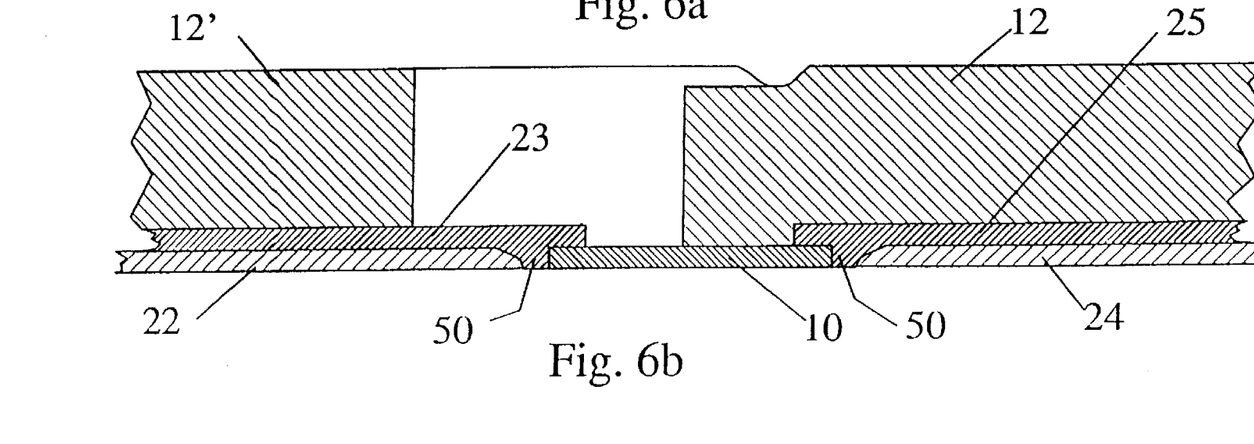

A further improvement to enhance the electrical isolation of the permanent magnet layers is illustrated in FIGS. 6a and 6b. In these figures, a small amount of electrically insulating material 23,25 has been interposed between the permanent magnetic layer 22, 24 and the MR element 10. This "spacer" 50 is preferably formed of a oxide such as $Al_2O_3$.

This spacer 50 effectively electrically isolates the MR layer and the current carrying contacts from the permanent magnetic layer while also permitting the magnetic flux coupling required to hold the MR layer in a single domain state. Use of the spacer will substantially confine all sense current to only those portions of the MR element for which the read sensitivity function is nearly symmetrical.

The structure shown in FIGS. 6a and 6b may be formed by using a process such as illustrated in FIGS. 7a–d.

Figure 7A:
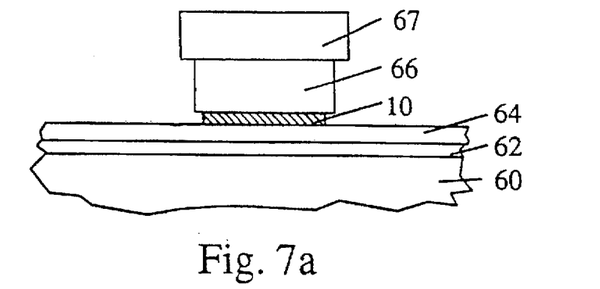
FIGS. 7a–d illustrate a preferred method for forming the alternative embodiment of FIGS. 6a and 6b.

Referring first to FIG. 7a, the conventional MR head is formed upon a substrate comprising a basecoat 60, a soft magnetic shield, 62, and a half-gap oxide layer 64, conventionally composed of aluminum oxide. The MR element 10 of the present invention is deposited and patterned upon this oxide layer 64 by using a special bi-layer lift off resist which has an upper section 67 broader than the lower section 66. (A single layer resist may also be used in an alternative approach.) In the inventive process, the MR element is over etched using a chemical etchant such that the resulting MR element has a width slightly less than the overlying resist structure. Thus, over etching removes not only portions of the MR layer that are uncovered by the overlying resist structure but also a portion of the MR element underneath the resist structure.

Figure 7B:
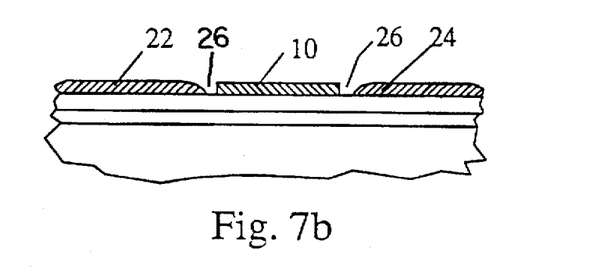

Referring to FIG. 7b, the permanent magnetic layers are now sputter deposited using these resist layers as a mask. This results in a structure, such as illustrated in FIG. 7b, where the permanent magnetic layers 22 and 24 are separated from the MR element 10 by small gaps 26, which corresponds to the amount of over etching of the MR element. Thus, as shown in FIG. 7b, permanent magnetic layers 22 and 24 are separated from each other by the width of the resist structure 66.

After the deposition of the permanent magnetic layers, the resist is removed by a lift off process. Thereafter, an electrical insulator layer 27 is deposited over the whole sensor. See FIG. 7c. This electrical insulator layer could be aluminum oxide, such as $Al_2O_3$. Next another layer 68 of resist is deposited over the insulator and patterned to expose 70 most of the MR layer 10, leaving small areas along the edge of the MR element covered by the resist. Using this resist mask 68, the insulator 27 is removed from over the MR sensor with an appropriate process such as selective chemical etching or ion milling to thereby expose the MR layer in this central gap region 70.

Figure 7C:
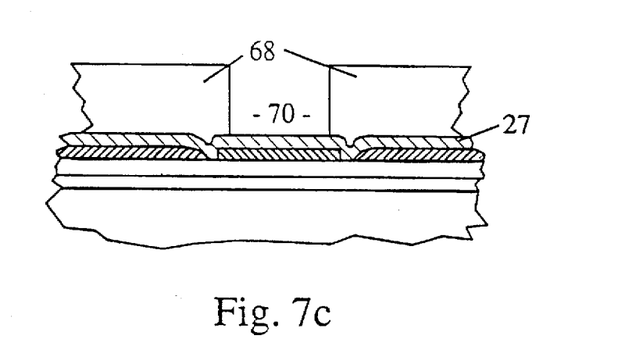
Figure 7D:
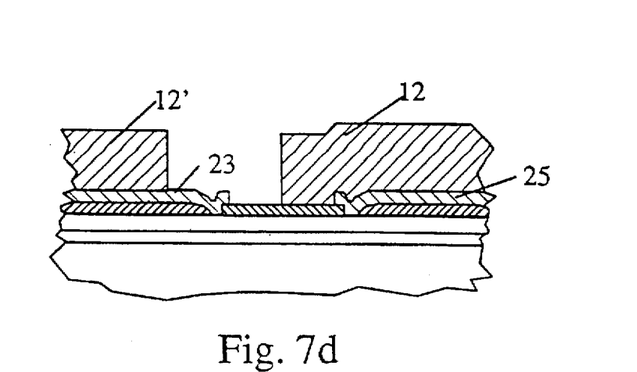

Thereafter, the resist 68 is stripped and the contacts 12 and 12' are deposited and patterned using conventional processes, resulting in the structure shown in FIG. 7d, which is substantially the same as the structure shown in FIG. 6b.

If one employs standard chemical techniques to remove photoresist, the bi-layer resist 66–67 of FIG. 7a may be replaced by a conventional single-layer resist.

Further, the process shown in FIG.'s 7a–d can be modified to produce the sensor structure of FIG. 3 by skipping the steps illustrated in FIG. 7c.

Figure 8:
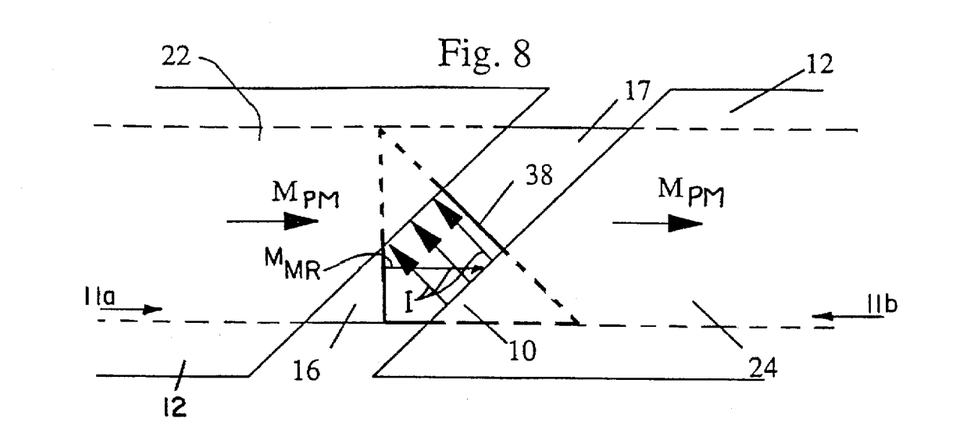
FIG. 8 is a diagram of an alternative embodiment having a triangularly shaped MR element which permits the use of less bias current.

FIG. 8 represents a variation designed to maximize the current efficiency of the sensor. In the figure, the MR element 10 has been configured as a triangle so as to eliminate the inefficient upper right hand portion 17 of the MR element. So configured, all current flowing between the contacts 12 will be favorably angled with respect to the at-rest MR element magnetization vector $M_{MR}$. Current flowing in the corresponding portions 17 of rectangular MR elements, such as shown in FIG. 3, operates on less flux than in portions closer to the air bearing surface represented by arrows 11a and 11b, and further, similar to region 16, has current which flows at angles substantially parallel to M. As a result, the operation of the MR sensor in such a region is highly inefficient.

Due to these considerations, the use of a triangular sensor and high resistivity permanent magnetic layer is expected to reduce overall current by a factor of 2, but also is expected to reduce sensor output only 25%, hence the current efficiency of the sensor is enhanced.

The orientation of the MR element's magnetization $M_{MR}$ at boundary 38 of the triangular MR element is directed left to right in the figure so that the respective magnetization vectors of the MR element and permanent magnet layers intersect their boundaries at approximately 45°. Even so, because the respective vectors are aligned, flux matching is accomplished using the same amount of permanent magnetic material as with rectangular elements. As a result, the MR element 10 has no unsaturated poles along edge 38 which could lead to domain formation.

Again referring to FIG. 3, the location of the read sensitivity "sweet spot" (area of maximum sensitivity) about which the read sensitivity is nearly symmetrical can be affected by lapping, a process necessary in thin film heads to control the throat height of an MR head's thin film writer and to expose the MR element to the head's air bearing surface represented by arrows 11a and 11b so that magnetic flux from the disc's surface may enter the MR element efficiently. For example, in the figure, lapping may extend up from the bottom of the figure to a point 30. This would have no effect on the effective location of the left-hand contacts 12' in the figure, but it would move the initial location of the right hand contact to the right in the figure. This movement, in turn, would move the center of the "sweet spot" of the read sensitivity function to the right.

This relative movement of the "sweet spot" causes a problem in aligning the MR element with a thin film writer which is also physically located on the same thin film structure (the writer will typically be formed of thin film layers subsequently formed - see e.g. U.S. Pat. No. 4,967, 298). The location of the "sweet spot" of the one should be accurately controlled with respect to the "sweet spot" of the other. The shifting of the "sweet spot" due to lapping is therefore undesirable.

Figure 9:
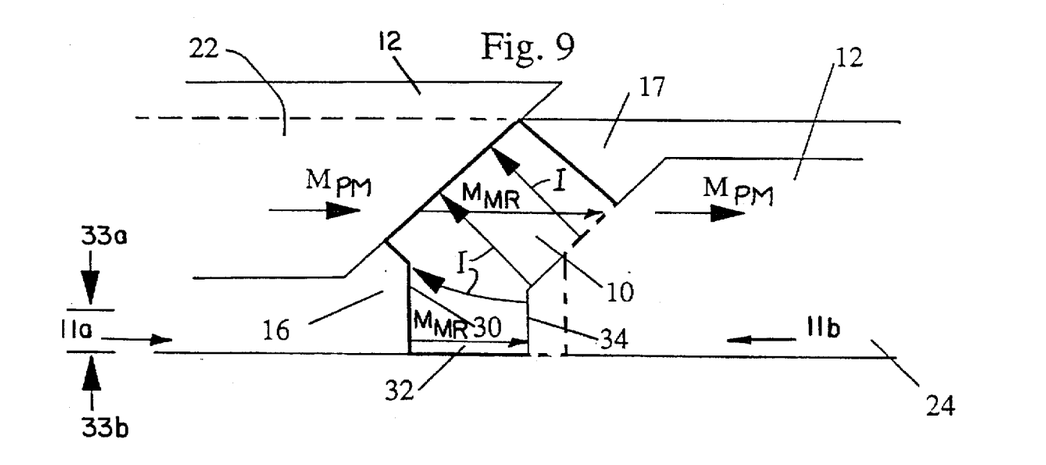
FIG. 9 is a diagram of a further alternative embodiment in which both the sensor and contacts are constructed so as to provide a magnetoresistive sensor with a lip designed to make the read sensitivity invariant with lapping.

A solution to this lapping-induced "sweet spot" shift problem is illustrated in FIG. 9. In the figure, the MR element is provided with a narrow extension 32 to the unlapped "air bearing" surface represented by arrows 11a and 11b. This extension 32 can be called a "lip". The right hand sense current contact 12 is provided with a elbow located above the highest point 30 of lapping tolerance (which is represented by arrows 33a and 33b) so as to form a vertically extending contact edge 34 to the unlapped ABS. So constructed, the width of 25 the "lip" provides the effective read width of the MR element, and the contact structure makes the location of the "sweet spot" invariant to lapping. High resistivity permanent magnet material or isolation gaps prevent disadvantageous current from flowing.

Current flowing from the "lip" contact edge 34 tends to flow perpendicularly from the edge. So directed, this current flow will primarily be directed parallel to the MR element's magnetization vector M and thus will provide virtually no component to the sensor's output response to input magnetic flux.

This sensor construction is lapping invariant and also eliminates the inefficient "back portion" 17 of the element as discussed in relation to the triangular element of FIG. 8.

Figure 10:
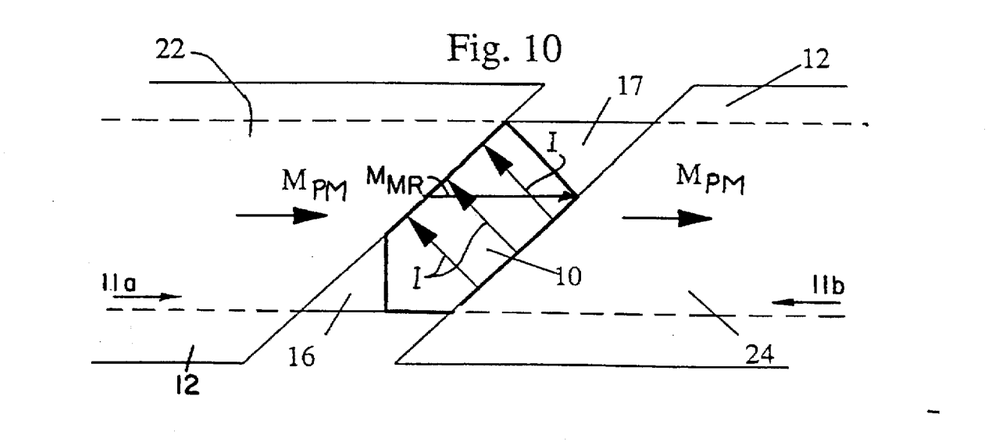
FIG. 10 is a variation on the preferred embodiment in which the inefficient portions of the MR element are removed.

FIG. 10 shows a modification to the basic design which eliminates the inefficient "back portion" of the element but which does not have a "lip."

Figure 11:
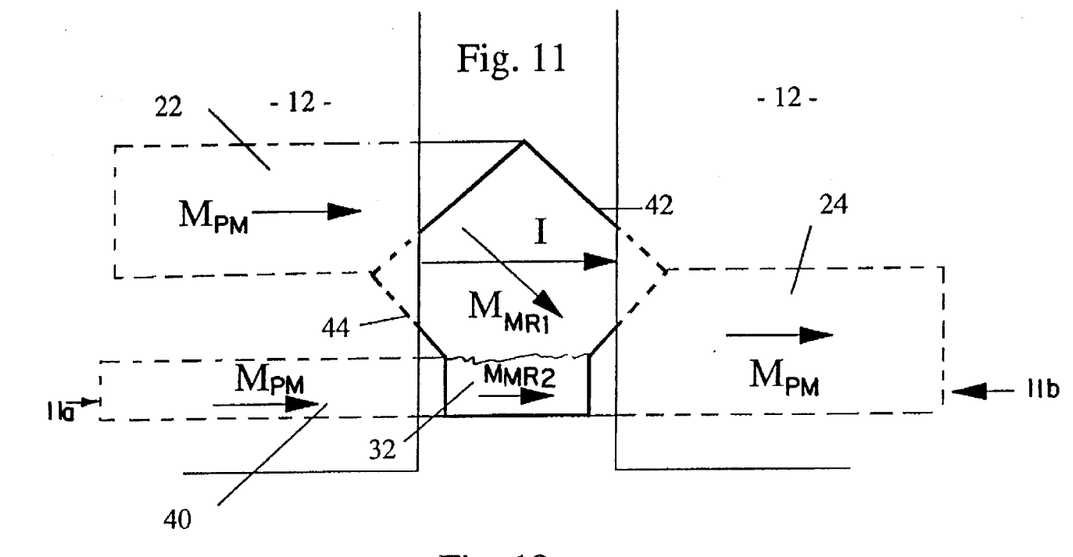
FIG. 11 is a diagram of an alternative construction of an MR element in which the at-rest magnetization vector of the MR element is rotated and wherein the rotated sensor is also provided with a lip separately stabilized.
Figure 12:
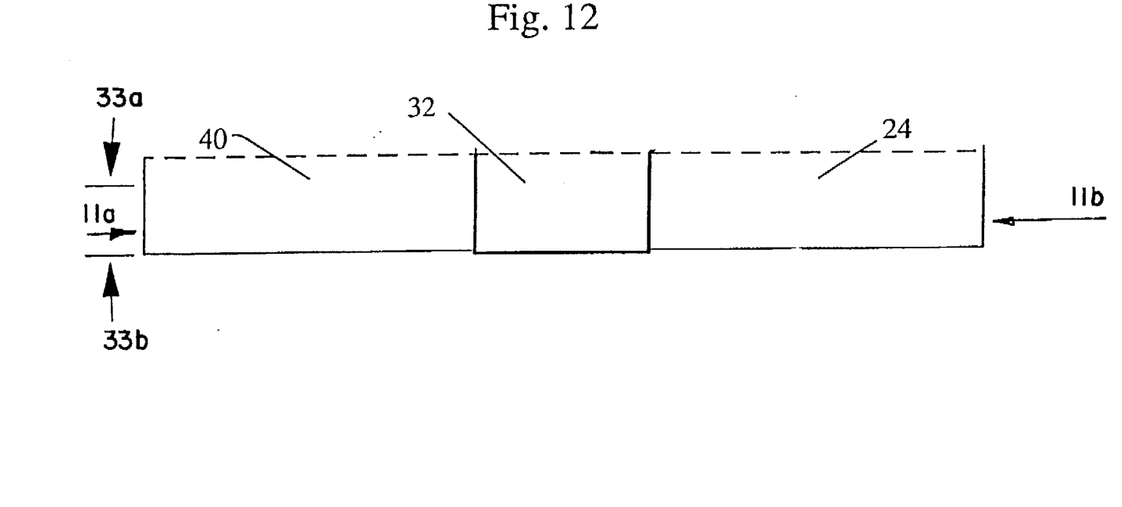
FIG. 12 is a diagram of an generalized configuration of the lip stabilization for the sensor of FIG. 11 that may be applied to any design.

FIG.'s 11 and 12 show a fundamentally different variation. Here the rectangular MR element is rotated approximately 45° with respect to the air-bearing surface represented by arrows 11a and 11b, thereby forming a "diamond" shape, and is provided with a "lip" 32. Contacts 12 are applied "squared up" to the ABS rather than slanted as in the original design. Permanent magnetic layers 22 and 24 are provided along the upper left and bottom right edges of the "diamond." All these layers are patterned during manufacture with their magnetization vector $M_{PM}$ directed parallel to the ABS, i.e., left to right in the figure. However, due to induced magnetic "charges" of opposite polarity being produced by the permanent magnetic layers at opposite edges, the magnetization vector $M_{MR1}$ of the MR element in the central region rotates so that it is directed between these edges, downward at 45° in the figure. Note however, that the magnetization vector $M_{MR2}$ of the "lip" remains directed parallel to the ABS. This is due to both the different geometry of the lip and because the magnetization at element edges tends to align itself parallel to the ABS edge.

In the figure, the "lip" is provided with a separate stabilization permanent magnetic layer 40. However, as suggested by FIG. 12, this is a design choice. The "lip" may also be stabilized by extension of the "active region" permanent magnet stabilization layer 22.

Because the permanent magnetic layer and MR element magnetization vectors are not directed in the same direction, the amount of permanent magnetic layer necessary to stabilize the domain structure of the MR element without introducing a longitudinal biasing field must be adjusted. The adjustment is made by multiplying the amount necessary when the vectors are aligned according to the following formula; wherein for a given boundary the permanent magnetic material has a magnetization $M_{PM}$ and a thickness $t_{PM}$, and the MR element has a magnetization $M_{MR}$ and a thickness $t_{MR}$, and the angles between $M_{PM}$ and $M_{MR}$ and the boundary are $theta_{PM}$ and theta MR, respectively, the amount of permanent magnetic material is chosen such that $$M_{PM}*t_{PM}*\sin(theta_{PM})=M_{MR}*t_{MR}*\sin(theta_{MR})$$

This sensor configuration has two fundamental advantages. First, the sense current contacts may be "squared up" so that they are lapping invariant and still provide a linearized output because sense current I and at-rest magnetization $M_{MRI}$ will be opened at approximately 45°. Second, the sensor has a "lip" which does not "read" at all, but instead acts as a pure flux guide.

Figure 13:
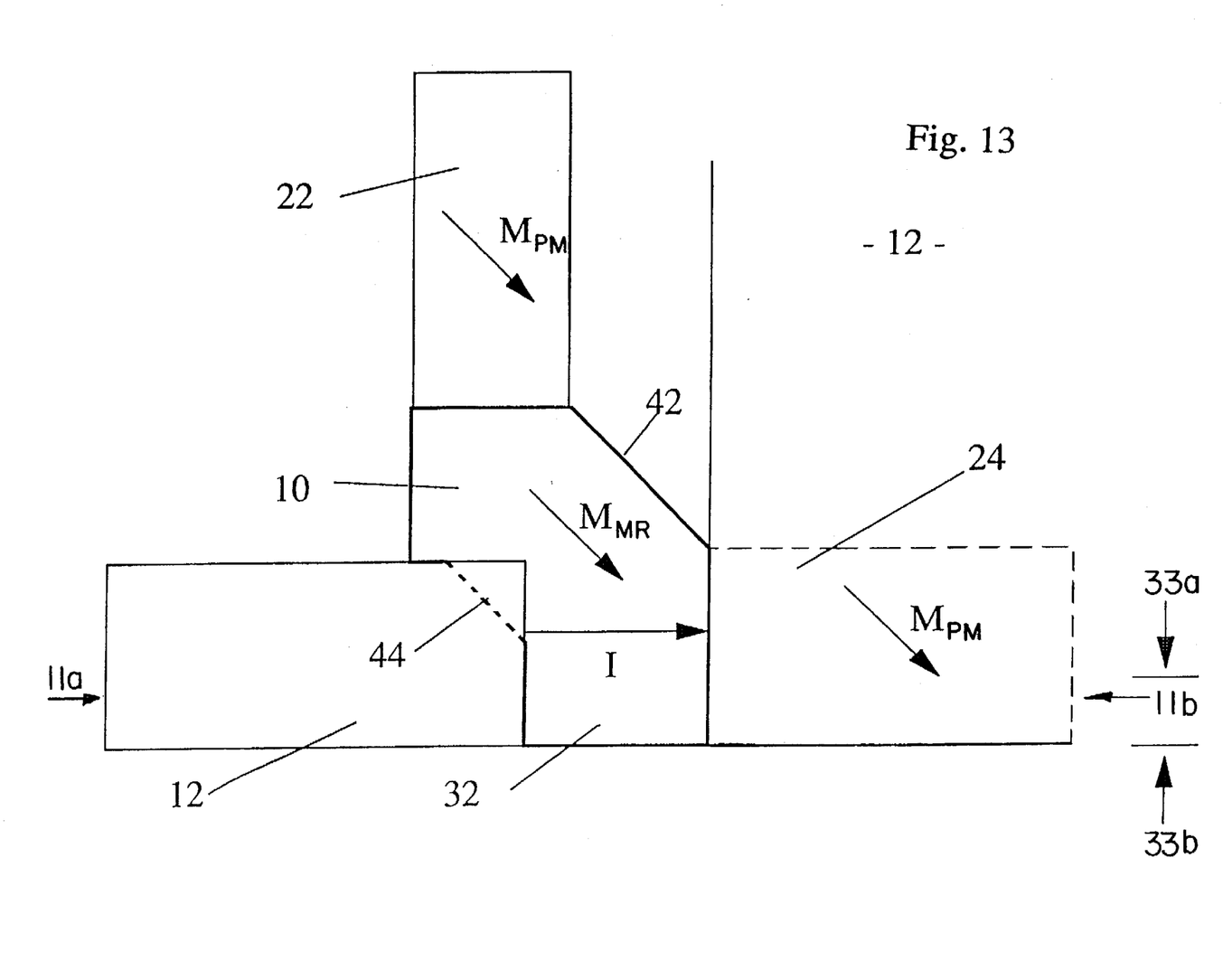
FIG. 13 is a diagram of an embodiment providing for a rotated, at-rest magnetization, squared-off contacts, and a lip, in which the read sensitivity function is relatively tolerant to lapping.

FIG. 13 illustrates a variation of this approach wherein the MR element 10 is patterned so that the "left hand" permanent magnetic layer 22 is formed such that the intersecting boundary between the layer 22 and the MR element 10 is direct parallel the MR head's ABS which is represented by arrows 11a and 11b. As illustrated in this figure, the magnetization vectors $_{PM}$ of the permanent magnetic layers are initially aligned in the same direction as the preferred MR element magnetization vector $m_{MR}$, downward to the right at 45°. Also, the leftmost sense contact 12 can be configured so that sense current I flows only in the substantially rectangular area just above the "lip" as indicated. So configured, the read sensitivity function compares favorably to MR sensors with external transverse biasing but without the loss in sensitivity caused by the transverse biasing field.

This sensor configuration requires that there be no permanent magnetic stabilization along the left edge of the lip area 32. Stabilization of this edge may instead be accomplished by spacing the sensor's soft magnetic shields close to the MR element at the ABS. Soft magnetic film layers are illustrated in FIG. 7a and at 62 and in the above incorporated '035 patent. See layers 15 of FIG. 1 or 23 of FIG. 3a.

Referring back to FIG. 11, which illustrates a "diamond" MR element 10, the "lip" structure can be described as a lapping intolerant "neck" section, connected to a "flux expanding" section, which is in turn is connected to the active sense region where current I flows in the MR element between the contacts 12. This lip construction is better illustrated in FIG. 14.

Figure 14:
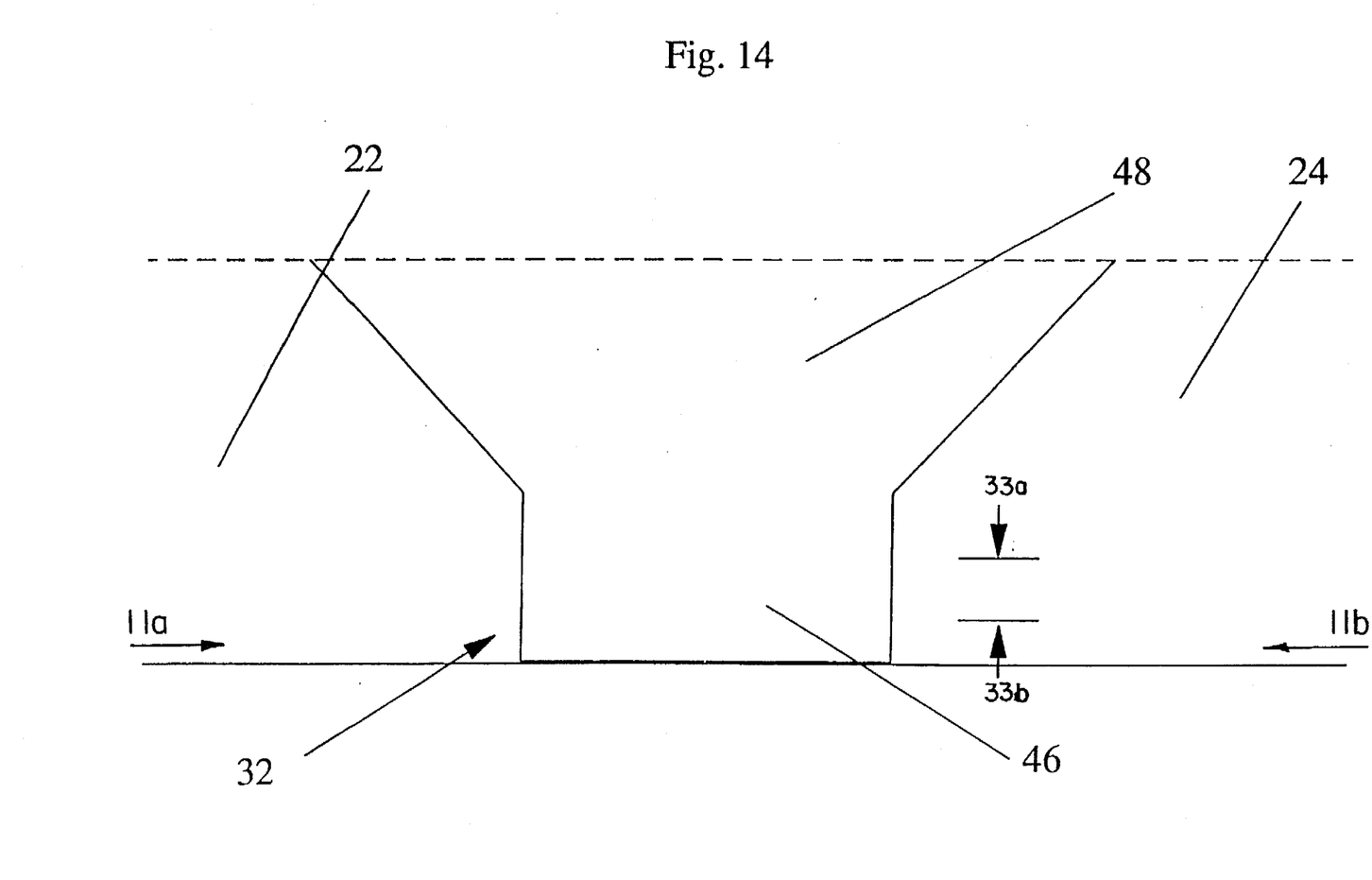
FIG. 14 is a diagram of a preferred lip structure with an expanded rear region to provide flux for a wider sensor than that determined by the lip width at the air bearing surface.

In this figure, the lip neck region is at reference 46 and the expander region is at reference 48.

This structure is a preferred lip structure with respect to all previously described "lip" embodiments. Although the flux density out of the lip is less than that in, the total sensor output can be increased by virtue of a larger area of interaction with the sensor's sense current. As a result, the read width of the MR sensor can be independently adjusted from the width of the active area so that each may be separately optimized.

Figure 15:
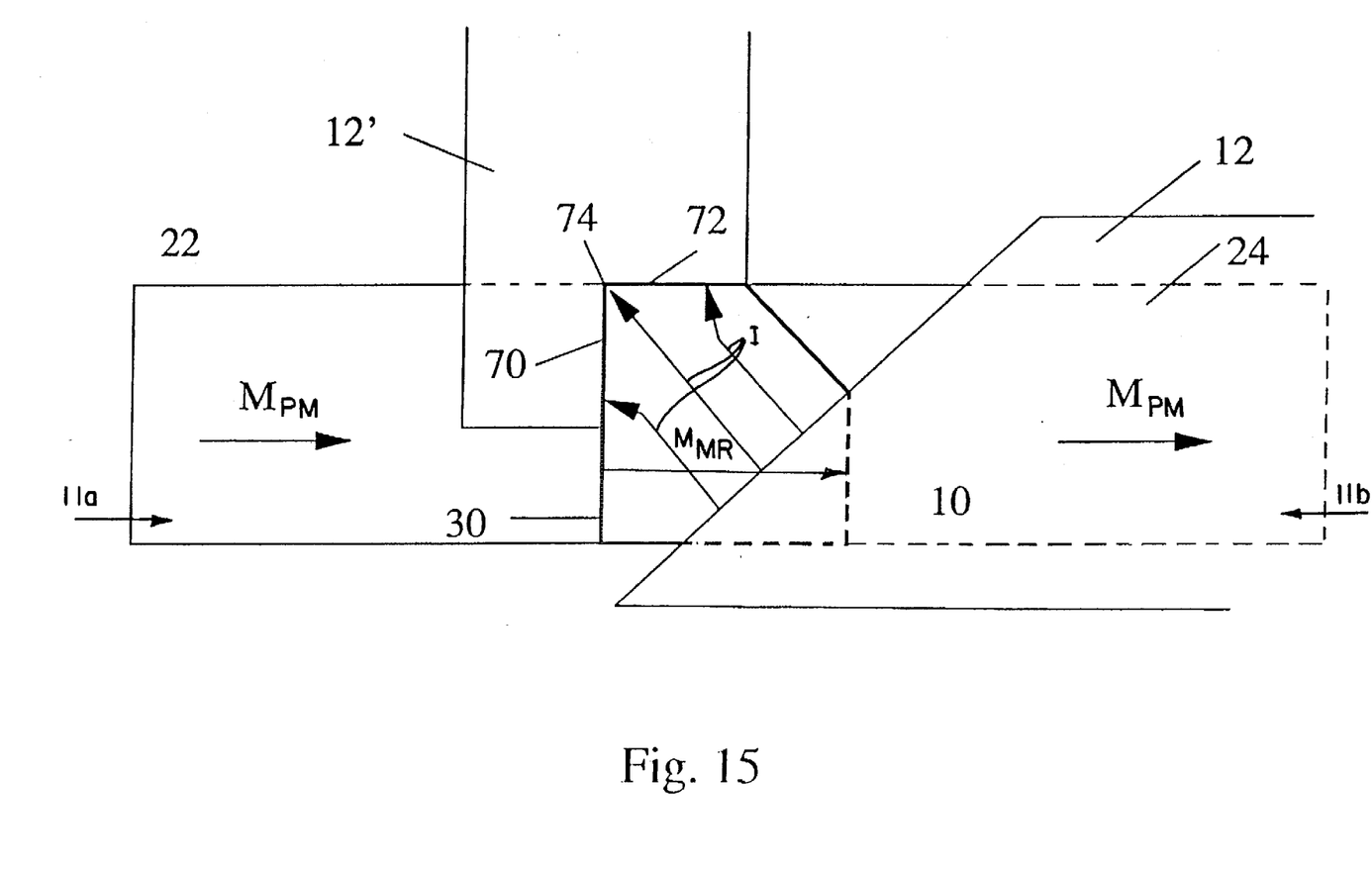
FIG. 15 is a diagram of an alternative embodiment illustrating a hybrid contract structure which yields improved read sensitivity symmetry.

FIG. 15 illustrates a variation on the sensor structure illustrated in either FIG.'s 9 or 10. In this variation, contact 12' is not canted as is contact 12, but rather is "squared up." The sensor in this configuration yields a more highly symmetrical read sensitivity function than designs with a slanted left contact.

In the figure, the left contact has two approximately orthogonal edges 70 and 72 interfacing with the MR element 10 at a vertex 74 approximately centered on the center of the current from the canted contact 12. One edge 70 is also approximately orthogonal to the air bearing surface defined by lapping up in the figure to point 30.

We claim:

1. A method of making a magnetoresistive sensor comprising:

forming a magnetoresistive element on a substrate, the magnetoresistive element having an end surface defining a plane intersecting the substrate, the magnetoresistive element having a first magnetization vector; and forming a permanent magnet having an end surface confronting the end surface of the magnetoresistive element and having a second magnetization vector, the first and second magnetization vectors having substantially equal magnitudes and directions to prevent magnetic flux discontinuities between the end surface of the magnetoresistive element and the end surface of the permanent magnet.

2. The method of claim 1 further including:

forming electrical insulating means for inhibiting electrical conduction between the end surface of the magnetoresistive element and the end surface of the permanent magnet.

3. The method of claim 1 wherein the magnetoresistive element is formed with a front surface for confronting a magnetic medium, the front surface being oriented approximately 45° relative the end surface of the magnetoresistive element, the method further including:

forming two contacts on the magnetoresistive element, the contacts having edges substantially normal to the front surface for conducting sense current in a direction substantially parallel to the front surface, so that the sensor has a magnetization vector rotated at approximately 45° relative to the front surface and has a sense current directed parallel to the front surface.

4. The method of claim 1 wherein the magnetoresistive element has a body with a width along a direction, the method further including:

forming a lip extension on the body of the magnetoresistive element, the lip extension having a front surface for confronting a magnetic medium and two side surfaces substantially perpendicular to the front surface, the front surface parallel to the direction and having a width less than the width of the magnetoresistive body; and forming an electrical contact on the lip extension, the electrical contact having a contact edge substantially perpendicular to the front surface.

5. The method of claim 6 wherein the body of the magnetoresistive element includes an active sensor region bounded at least in part by two contact edges which are separated by a distance greater than the width of the front surface of the lip extension.

6. The method of claim 4 wherein the contact edge extends to the front surface of the lip extension, the method further including:

forming another electrical contact contacting the lip extension and having a contact edge substantially perpendicular to the front surface of the lip extension.

7. The method of claim 1 wherein the magnetoresistive element is formed in the shape of a square.

8. The method of claim 1 wherein the the magnetoresistive element is formed in the shape of a triangle.

9. The method of claim 1 wherein the permanent magnet has a resistivity substantially greater than the resistivity of the magnetoresistive element.

10. The method of claim 1 wherein the end surface of the magnetoresistive element defines an edge of a read sensitivity function, the method further including:

forming an electrical contact on the magnetoresistive element, the electrical contact having an edge defining another edge of the read sensitivity function.

11. The method of claim 10 wherein the end surface of the magnetoresistive element and the contact edge define a substantially symmetric read sensitivity function.

12. The method of claim 1 wherein the magnetoresistive element has a front surface for confronting a magnetic medium, the method further including: forming an electrical contact edge on the magnetoresistive element, the contact edge canted at approximately 45° relative the front surface.

13. The method of claim 1 wherein the magnetoresistive element has a front surface for confronting a magnetic medium, the method further including:

forming an electrical contact having one contact edge perpendicular to the front surface of the magnetoresistive element and having another contact edge oriented 45° relative the front surface.

14. The method of claim 1:

wherein forming the magnetoresistive element includes:

forming a magnetoresistive layer;

forming a mask structure on the magnetoresistive layer;

over etching the magnetoresistive layer to remove unmasked portions of the magnetoresistive layer and to remove a portion of the magnetoresistive layer underneath the mask structure; and wherein forming the permanent magnet includes depositing permanent magnetic material on the substrate with the mask structure in place to form a permanent magnetic layer, the permanent magnetic layer being spaced from the magnetoresistive element due to the over etching.

15. The method of claim 14 further including:

lift off processing the mask structure;

depositing a layer of electrical insulating material over and between the magnetoresistive element and the permanent magnet;

removing a portion of the electrical insulating material to expose a part of the magnetoresistive element; and forming an electrical contact on the electrical insulating material and the exposed part of the magnetoresistive element.

16. The method of claim 1, wherein the magnetoresistive element has a magnetization $M_{MR}$ and a thickness $t_{MR}$ at the end surface thereof, and the permanent magnet has a magnetization $M_{PM}$ and a thickness $t_{PM}$ at the end surface thereof, the magnetizations $M_{MR}$ and $M_{PM}$ forming respective angles $theta_{MR}$ and $theta_{PM}$ with the end surface of the magnetoresistive element, the end surface of the magnetoresistive element and the end surface of the permanent magnet substantially characterized by:

$$M_{MR}*t_{MR}*\sin(theta_{MR})=M_{PM}*t_{PM}*\sin(theta_{PM}).$$

17. A process for making a magnetoresistive sensor comprising:

forming a thin film magnetoresistive element on a substrate; forming a mask structure on the magnetoresistive element; over etching the magnetoresistive element to remove unmasked portions of the magnetoresistive element and a portion of the magnetoresistive element underneath the mask structure; and depositing permanent magnetic material on the substrate with the mask structure in place to form a permanent magnet, the permanent magnet being spaced from the magnetoresistive element due to the over etching.

18. The method of claim 17 further including:

lift off processing the mask structure;

depositing electrical insulating material over and between the magnetoresistive element and the permanent magnet;

removing a portion of the electrical insulating material to expose a part of the magnetoresistive element; and forming an electrical contact on the electrical insulating material and the exposed part of the magnetoresistive element.

19. The method of claim 16 further including:

removing the mask structure; and forming electrical contacts on the electrical insulating layer and the magnetoresistive element.

20. The process of claim 17 wherein the process yields a magnetoresistive sensor having a substantially symmetric read sensitivity across the sensor.

21. A process for making a magnetoresistive sensor comprising:

forming a thin film magnetoresistive element on a substrate;

forming mask structure on the magnetoresistive element, the mask structure having a width;

over etching the magnetoresistive element to remove unmasked portions of the magnetoresistive element and a portion of the magnetoresistive element underneath the mask structure so that the width of the magnetoresistive element is less than the width of the mask structure; and depositing permanent magnetic material on the substrate with the mask structure in place to form at least two permanent magnets spaced from the magnetoresistive element and spaced apart by the width of the mask structure.

* * * * *

UNITED STATES PATENT AND TRADEMARK OFFICE
CERTIFICATE OF CORRECTION

PATENT NO. : 5,736,060
DATED : APRIL 7, 1998
INVENTOR(S) : PETER K. GEORGE ET AL.

It is certified that error appears in the above-identified patent and that said Letters Patent is hereby corrected as shown below:

Col. 1, line 20, delete "tile", insert --the--

Col. 1, line 25, delete "am", insert --are--

Col. 2, line 14, delete "IVIR", insert --MR--

Col. 3, line 30, delete "contract", insert --contact--

Col. 3, line 55, delete "i", insert --I--

Col. 3, line 65, after FIG. 2. Make a new paragraph starting with the word "Turning"

Col. 4, line 45, delete "know", insert --known--

Col. 8, line 3, delete "opened", insert --oriented--

Signed and Sealed this

Fourth Day of May, 1999

*Attest:*

Q. TODD DICKINSON

*Attesting Officer*  Acting Commissioner of Patents and Trademarks